United States Patent [19]

Lonka

[11] Patent Number: 5,006,667
[45] Date of Patent: Apr. 9, 1991

[54] METHOD AND APPARATUS FOR SHIELDING A PRINTED CIRCUIT BOARD

[75] Inventor: Pekka Lonka, Salo, Finland
[73] Assignee: Nokia Mobile Phones Ltd., Finland
[21] Appl. No.: 539,618
[22] Filed: Jun. 18, 1990

[30] Foreign Application Priority Data

Jul. 5, 1989 [FI] Finland ................................ 893282

[51] Int. Cl.⁵ .............................................. H05K 9/00
[52] U.S. Cl. .................................. 174/35 R; 361/424; 29/592.1
[58] Field of Search ...................... 174/35 R; 361/424; 219/10.55 R, 10.55 D; 29/592.1

[56] References Cited

U.S. PATENT DOCUMENTS

| | | | |
|---|---|---|---|
| 4,631,641 | 12/1986 | Brombal et al. | 361/424 |
| 4,713,633 | 12/1987 | Saito et al. | 333/222 |
| 4,890,199 | 12/1989 | Beutler | 361/424 |
| 4,903,170 | 2/1990 | Finney et al. | 361/424 |
| 4,912,604 | 3/1990 | Väisänen | 361/424 |

FOREIGN PATENT DOCUMENTS 3736833 5/1989 Fed. Rep. of Germany ...... 361/424

Primary Examiner—Leo P. Picard
Assistant Examiner—Bot L. Ledynh
Attorney, Agent, or Firm—Darby & Darby

[57] ABSTRACT

The invention relates to a method and a shielding housing for shielding a printed circuit board, or a part of it, from disturbances caused by electromagnetic interference (EMI). In the method, during the manufacturing phase of the printed circuit board there are cut in the board slots (U) through the printed circuit board (pc), the length of the slots being L. The first part (2) of the housing is soldered to the printed circuit board (pc) in such a way that it approximately interconnects the ends of the cut slots (U). This first part constitutes one side wall of the shielding housing. The second part (1) of the shielding housing is made up of a cover (5) and three side walls, in which there is formed an inside groove having a height which corresponds to the thickness of the printed circuit board. After the soldering of the components, this second part (1) is slipped on the printed circuit board so that the printed circuit part between the slots (U) cut in the printed circuit board will be left on the inside of the side walls (7, 7',7") of the second part (1) and will bear on the inside grooves of the inner walls. The first part (2) and the second part (1) have locking means (3, 4) which lock the parts detachably to each other.

8 Claims, 2 Drawing Sheets

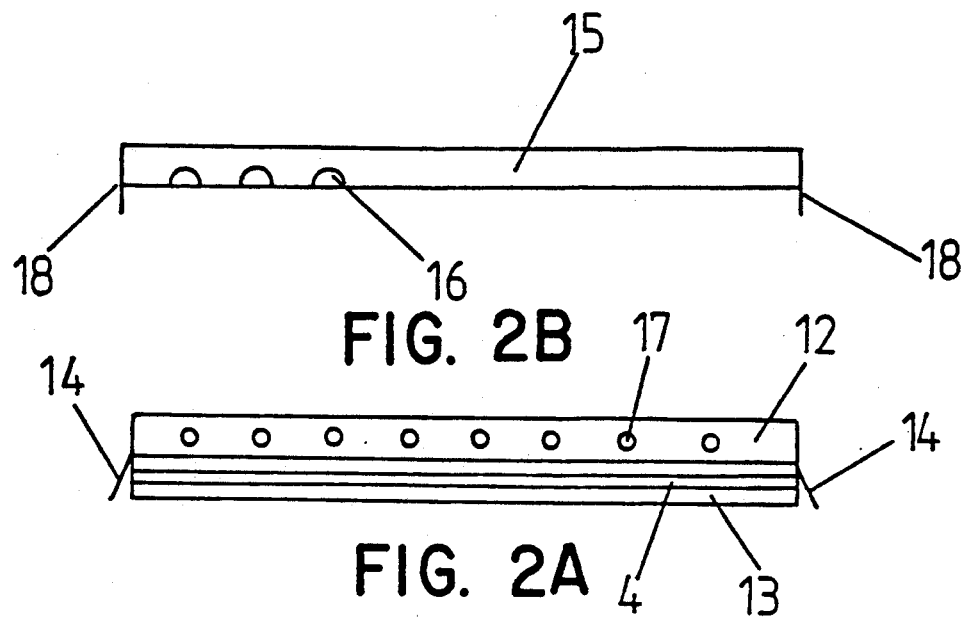
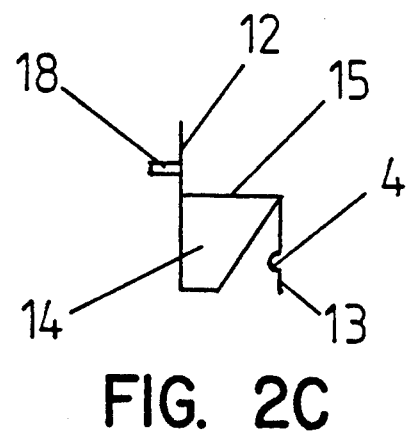
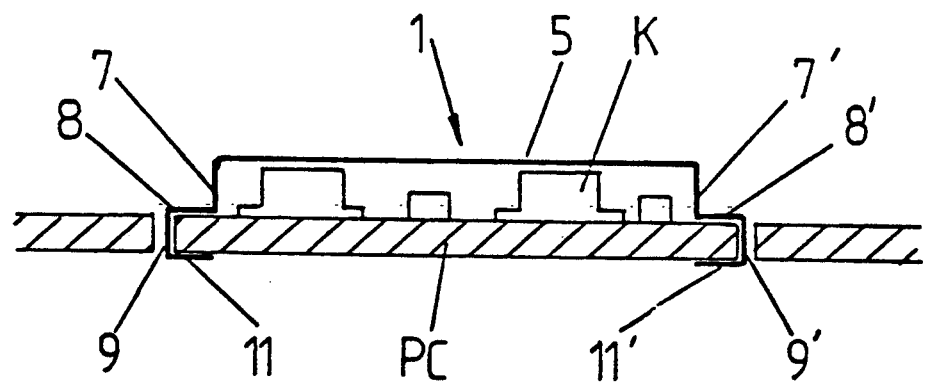

METHOD AND APPARATUS FOR SHIELDING A PRINTED CIRCUIT BOARD

BACKGROUND OF THE INVENTION

The present invention relates to a method of shielding a printed circuit board, or a part of it, from disturbances caused by electromagnetic interference (EMI), the printed circuit board or its part being enclosed in a shielding housing which comprises a cover part with adjoining side parts. The invention also relates to a shielding housing for use in the method.

It is known that in electronic equipment in which the packing density, of components and the frequencies used are relatively high, there is the problem of electromagnetic coupling between different functional circuits. This coupling, i.e. electromagnetic interference (EMI), causes disturbances in the functioning of the circuits. The circuits have to be shielded in order to prevent this coupling. High requirements are set on the shielding methods with respect to shielding effect, the space requirement of the shield, its weight, price, usability for shielding parts of a printed circuit, and the detaching and attaching properties of the shield.

It is well known in the art to place the entire electric circuit to be shielded in a metal shielding housing, from which signals travel via interference-shielded connectors to other circuits. However, such a solution is space-consuming, increases the weight of the device, and is not very practical when there are several areas to be shielded separately on the same printed circuit board.

It is also known to shield certain parts on a printed circuit board with various metal shielding covers. In such a case, various methods are used. In such method a housing with a cover and side walls is placed on the printed circuit. At the lower edges of the side walls there are tabs which, during the installation of the housing, pass into apertures in the printed circuit board and are bent on the other side of the board into an orientation parallel to the lower surface of the board, thus securing the housing firmly to the board. For purposes of maintenance of the printed circuit, the bent tabs are straightened out, whereupon the housing can be detached. Such a method is described in, for example U.S. Pat. No. 4,370,515. Another method involves encasing the circuit to be shielded in a metal wall, the lower edge of which is soldered to the printed circuit board. A cover is placed so as to bear on the wall, the edges of the cover are flexibly bent so that, when the cover is pressed over the upper edge of the wall, the flexible cover edges will produce a locking effect. These methods are highly usable when the lower surface of the printed circuit board is a continuous ground foil which serves as a shield on that side. However, the circuit board material used must be relatively thick in order to maintain the elastic property and, if the lower surface of the printed circuit board is not a continuous metal foil, arranging shielding on this side is cumbersome, and thus it is difficult to achieve a perfect shielding effect.

SUMMARY OF THE INVENTION

The present invention provides a solution by means of which a shielding housing is obtained which is easy and rapid to install and, can be detached without soldering and to which it is easy to connect filters or feed-through-capacitors for connection of the shielded circuit to the rest of the environment. The shielding structure according to the invention is light in weight and, by means of it, a part of a printed circuit can be shielded on all sides.

The method according to the invention is characterized in what is stated in method claim 6, and the shielding housing used in the method is defined in claim 1.

In the method according to the invention, slots through the printed circuit board are cut at the manufacturing stage of the printed circuit board, on the edges of the circuit part to be shielded. The slots are cut starting from the edges of the printed circuit board and are extended so far that the area to be shielded is, in its entirety, left between them. Thereafter the components are attached to the printed circuit board. An end wall according to the invention is attached approximately between those end points of the slots which are farthest from the edges of the printed circuit board. Thereafter a shielding housing according to the invention is used, which housing comprises a cover and three side walls with grooves inside. The distance of the cut slots from each other is the same as the mutual distance of the grooves on the opposite housing walls, the housing thus being capable of being pushed onto the printed circuit board so that the edges of the board between the slots push into the grooves inside the housing, whereupon the circuit area between the cut slots is left between the housing walls. When the pushing is continued, a bend in the upper part of the separate end wall attached to the printed circuit board pushes inside the housing and becomes locked to the housing cover. In the end wall there are also small side flanges, which also push inside the housing, following its side walls.

In this manner an EMI-shielding housing is obtained, which is easy to detach and to re-attach. When it is desired to attach a shielding sheet also under the printed circuit board, it is easy to do so according to the invention. When the grooves intended for the printed circuit board are made in the side walls of the shielding housing, the last bend, parallel to the printed circuit board surface, in the opposite walls is made so long that the bends somewhat overlap. These bonds thus form a bottom for the sheilding housing which is left against the lower surface of the printed circuit board when the housing is pushed into the slots in the printed circuit board. Alternatively, a separate bottom sheet can be used which is placed so as to bear on the housing walls on the lower surface of the grooves intended for the printed circuit board. These lower surfaces are parallel to the printed circuit board surface, and the bottom sheet in the installed position will be left, supported by these lower surfaces, against the lower surface of the printed circuit board.

BRIEF DESCRIPTION OF THE DRAWINGS

The invention is described in greater detail with reference to the embodiments depicted in the accompanying drawings, in which FIGS. 2A–2C depict top and side views of the separate side wall of the shielding housing, and FIG. 3 is a cross section of a shielding housing installed on a printed circuit board.

DESCRIPTION OF AN AN ILLUSTRATIVE EMBODIMENT

Figure 1:
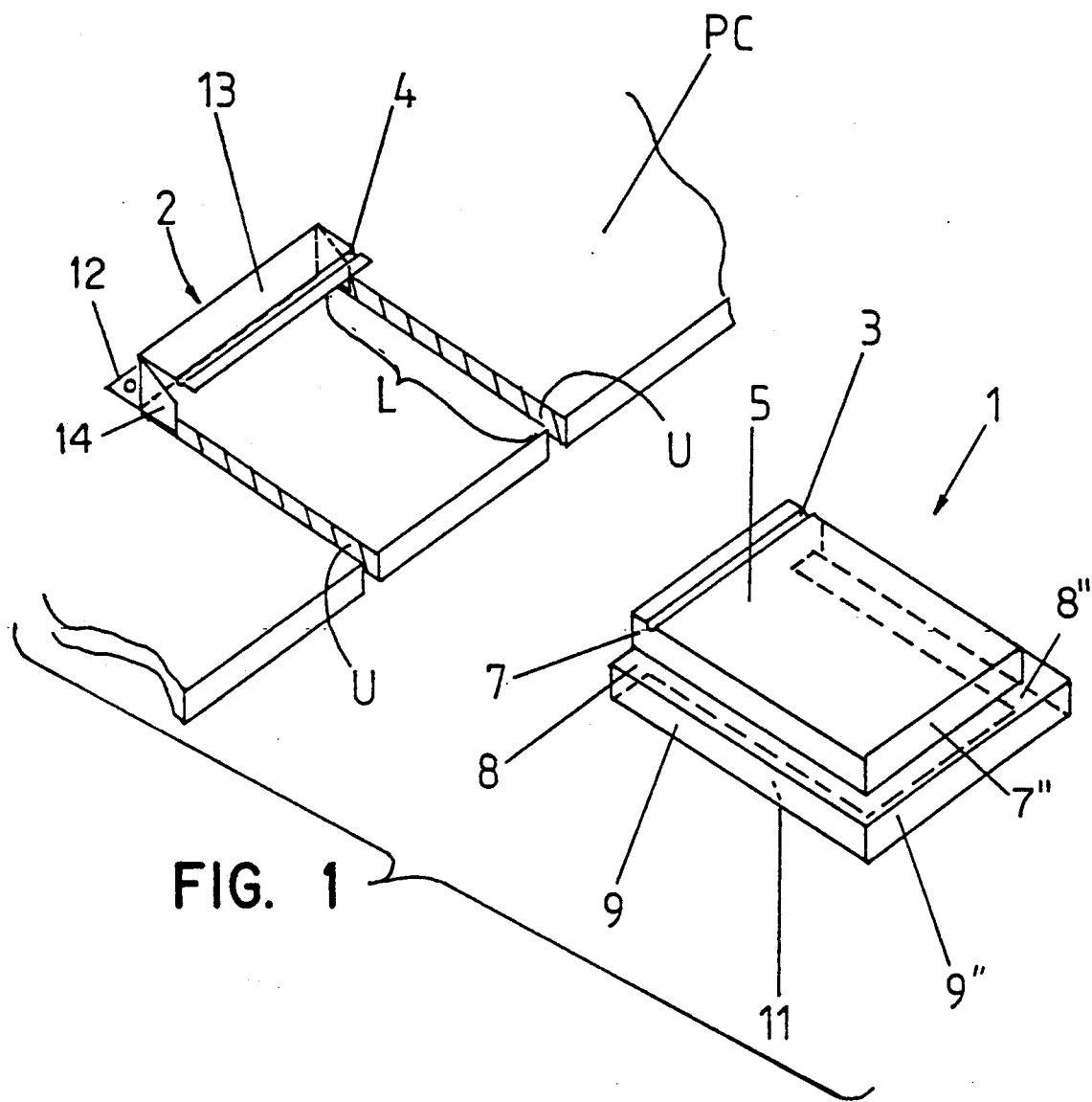
FIG. 1 is a diagram of the principle of the shielding housing according to the invention and of its positioning on a printed circuit board.

The representation in FIG. 1 illustrates a method of EMI shielding a part of a printed circuit board. Starting from the edges of the printed circuit board ("pc"), slots U which go through the printed circuit board and have the length L are cut. The distance between the slots to be cut and their length L are determined by the area to be shielded. After the cutting of the grooves and the attaching of the electronic components, that part of the printed circuit pc to be protected is encased entirely or in part in a metal shielding housing. This shielding housing according to the invention is made up of two parts: end wall 2 and housing 1. The end wall 2 is an oblong piece, the cross section of which is approximately a ⌠-profile. The housing 1 is made up of a cover 5 and of three profiled sides abutting it.

The structure of the end wall 2 is shown in greater detail in FIGS. 2 A-C. The profile has two approximately parallel flanges 12 and 13 and an intermediate part 15 interconnecting them and forming one wall of the shielding housing in the final installation. The flanges 12 and 13 are oriented in opposite directions from the intermediate part 15. At both ends of the oblong ⌠-profile piece 2 there are, in addition, end flanges 14, which narrow towards their ends and extend from the intermediate part 15 in the same direction as does the flange 13. The end wall 2 is attached to the printed circuit board by soldering the flange 12 to it, a number of apertures 17 having been punched in the flange 12 for the soldering tin.

In order to align the end wall correctly to the printed circuit board pc, short tabs 18 can be formed at the end of the flange 12, the tabs being aligned with the alignment apertures drilled in the printed circuit board. In the other flange 13, a longitudinal groove or ridge 4 is formed. This groove or ridge is intended to engage a corresponding groove or ridge 3 in the cover 5 of the housing 1 at the end of the installing (FIG. 1). To enable the shielded part of the printed circuit board to be connected electrically to the other circuits on the printed circuit board, there are formed for this purpose in the intermediate part 15 a number of apertures 16 to which πfilters or feedthrough-filter capacitors can be soldered, via which the circuit to be shielded is connected to the rest of the printed circuit board. The dimensions of the end wall can be selected freely, but it is advantageous to aim at small dimensions. In this case it is advantageous to select as the height of the ⌠-profile, i.e. as the height of the intermediate part is forming the end wall the same distance as is the dimension, from the surface to the top of the printed circuit board pc, of the highest component of the circuit to be protected. The width of the flange 12 is selected so that reliable soldering will be possible, and the projections of the flange 13 and the end flanges 14 are selected so that they will extend over some distance to the inside of the housing 1. The ⌠-profile which constitutes the end part of the shielding structure can be formed by bending one single sheet-metal blank.

The second part of the shielding structure is a housing 1 which has a cover 5 and three sides abutting it. The structure of the sides is shown in FIGS. 1 and 3. Side parts 7, 7', 7" are approximately perpendicular to the plane of the cover and abut it. These side parts shield from the side the components to be shielded, as shown in FIG. 3. The height of these side parts corresponds to the distance of the highest component from the surface of the printed circuit board. The other side parts consist of successive bends 8, 9, 11; 8', 9', 11'; 8", 9", 11". By means of these bends, an inside groove is formed on three sides of the housing. The groove is dimensioned so that the edge of the printed circuit board fits suitably to move in the groove. In the cover 5 there is formed close to its open side the ridge or groove 3 which is parallel to this side edge, the groove being intended to engage the corresponding groove or ridge 4 in the flange 13 of the end wall 2.

The shielding method according to the invention is described briefly, still referring to FIG. 1: When the printed circuit board is being cut to shape with a miller, the necessary number of slots U are cut. The end wall 2, in the apertures 16 of which filters are soldered, is attached, for example, by soldering on the printed circuit board in the component installing phase.

The housing 1 is pushed into the slots U so that the printed circuit board area between them comes inside the housing and the edges of the printed circuit board some in the inside grooves of the housing 1. When the pushing is continued, the flange 13 and end flanges 14 of the end wall come inside the housing 1, against the cover 5 and the sides 7, 7'. Since the material is elastic and the flanges 13 and 14 have been suitably bent, they will come tightly against the inner surfaces of the housing 5. At the end of the pushing movement the groove 4 of the flange 14 engages the ridge 3 in the cover 5, locking the parts to each other. No other fastening is needed.

When necessary, the housing 1 can easily be detached and reattached.

FIG. 3 shows a cross section of the shielding housing installed on a printed circuit board pc. The figure illustrates how, when the housing 1 is being pushed into the slots cut in the printed circuit board, the edges of the printed circuit board in the area to be protected come into the grooves formed on the inner walls of the shielding housing, the grooves being limited by wall parts 8, 9, 11; 8', 9', 11'. The cover 5 of the housing may bear, in accordance with the figure, on the upper surfaces of the components K. If there is a risk of short circuit because of this, the risk of short circuit can be eliminated by coating the inside of the cover 5 entirely or in part with a suitable insulating material.

The housing 1 can be manufactured by any known technology, for example, by pressure forming from sheet metal.

FIGS. 1-3 show a shielding housing in which the flange-like parts 11, 11', 11" of the wall parts forming the inside grooves are rather narrow, extending over only a small distance inward on the lower surface of the printed circuit board. This suffices, if the lower surface of the printed circuit board is a continuous ground plane which serves as a shield from this direction. If this is not the case, the lower surface can be shielded by making the flange-like parts 11, 11' so wide that they in part overlap, whereby a continuous metal shield is formed also on the lower surface of the printed circuit board. Alternatively, it is possible to use a separate metal sheet the width of which is equal to the distance of the slots U from each other, in which case, when the housing is pushed into the grooves, this metal sheet is placed against the lower surface of the printed circuit board, whereupon it is left, in the installed state, to be supported by the flange-like parts 11, 11', 11".

Above, a case is described in which in a printed circuit board there are cut slots into which the shielding housing is pushed. It is clear that if the printed circuit area to be shielded is within a corner area of the board, only one slot is needed, in which case the printed circuit board edge abutting this slot and the outer edges of the board will push into the grooves inside the housing. It is also possible to cover the entire printed circuit board with a housing according to the invention, in which case the outer edges of the printed circuit board will push into the inside grooves of the housing. It is further possible to protect desired parts on the printed circuit board by cutting slots and by pushing the shielding housing into the slots, as described above, and finally to shield the entire printed circuit board with one housing covering it.

The structure according to the invention enables a very thin shielding housing material to be used, in which case the parts 1 and 2 of the shielding housing can be made, for example, from a spring bronze of 0.1–0.2 mm. The structure is light in weight, simple, and easy to attach and detach. Since it can be made low, it takes only little space. A good and tight shield is accomplished in each direction. The structure is usable wherever EMI-shielding is required, for example in paging devices, radio telephones, televisions, etc.

I claim:

1. A shielding housing for shielding a printed circuit board, or a part of it, from disturbances caused by electromagnetic interference (EMI), characterized in that the shielding housing comprises:
    a first part (2) which constitutes one separate shielding-housing end, the cross section of which is approximately a -profile with a center part (15) and edge flanges (12, 13) projecting generally perpendicularly in opposite directions from opposite edges of the center part, said first part further including end flanges (14) projecting generally perpendicularly in the same direction from a side of the center part (15) of the -profile;
    a second part (1) having a cover (5) and three side walls abutting it and being at an angle to it so as to leave on open side;
    a flange-like inside groove being formed in said second part by means of successive bends (8, 9, 11; 8', 9', 11'; 8", 9", 11") at those edges of the side walls which are opposite in relation to the cover, the width of which groove corresponds to the thickness of the printed circuit board (pc); and
    a ridge groove formed in the cover (5) close to the open side and parallel to it.

2. A shielding housing according to claim 1, characterized in that in the center part (15) of the -profile of the first part (2) there are apertures (16) to which filters can be attached for connecting the circuit to be protected to the rest of the printed circuit board.

3. A shielding housing according to claim 2, characterized in that there are first and second edge flanges, in the first edge flange (12) of the -profile there are apertures (17) for facilitating its soldering to the printed circuit board and in the second edge flange (13) there is a ridge groove (4) running in the longitudinal direction of the second edge flange.

4. A shielding housing according to claim 3, characterized in that from the ends of the first edge flange (12) of the -profile there project, perpendicularly from the first edge flange, tabs (18) which are intended for aligning the first part (2) with apertures in the printed circuit board.

5. A shielding housing according to claim 1, characterized in that the second part of the shielding housing has side walls with lower edges (11, 11', 11"), which lower edges are bent in the orientation of the a lower surface of the printed circuit board so that they partly overlap, whereby a continuous metal shield is formed on the lower surface of the printed circuit board to be shielded.

6. A method for shielding a printed circuit board, or a part of it, from disturbances caused by electromagnetic interference (EMI), wherein the printed circuit board or its part is encased in a shielding housing, characterized by the steps of:
    cutting in the printed circuit board (pc), starting from an edge of the printed circuit board, at least one slot (U) through the board, the slots extending to a distance (L), determined by the area to be shielded, from the edge of the printed circuit board;
    providing a first part of the shielding housing, which first part has a profile with first and second edge flanges projecting generally perpendicularly in opposite directions from a center part and end flanges projecting generally perpendicularly from the sides of the center part;
    fastening the first part of the shielding housing to the printed circuit board by the first edge flange of the profile;
    providing a second part of the shielding housing, which second part has a cover, three abutting side walls at an angle to the cover and successive bends in the sides at ends remote from the cover so as to form flange-like inside grooves;
    slipping the second part of the shielding housing over the printed circuit board in such a manner that one of the portions of the printed circuit board between slots (U) cut in the portions of the printed circuit board and the printed circuit board between a cut slot and the edge of printed circuit board edge, will be left on the inside of the side walls of the second part of the shielding housing and will be received in the flange-like inside grooves formed in the side walls, whereupon the second flange of the profile of the first part will come tightly against the inside surface of the second part; and
    providing one of a channel and a ridge in each of the second edge flange of the first part and the cover, whereby the channel is locked in the ridge.

7. A method according to claim 6, characterized in that the slots (U) through the printed circuit board are cut during the same process as the printed circuit board (pc) is cut into shape by using a miller.

8. A method according to claim 6, characterized in that a lower side of the printed circuit board is shielded using a separate metal or metallized sheet which attaches by its edges between a bend (11, 11', 11"), parallel to the lower side of the printed circuit board, of the grooves of the side walls of the second part (1) of the shielding housing and the printed circuit board.

* * * * *